US008525911B2

(12) United States Patent
Shoji

(10) Patent No.: US 8,525,911 B2
(45) Date of Patent: Sep. 3, 2013

(54) SOLID-STATE IMAGING DEVICE AND IMAGING DEVICE

(75) Inventor: Takashi Shoji, Kanagawa (JP)

(73) Assignee: Sony Corporation, Tokyo (JP)

( * ) Notice: Subject to any disclaimer, the term of this patent is extended or adjusted under 35 U.S.C. 154(b) by 253 days.

(21) Appl. No.: 13/053,950

(22) Filed: Mar. 22, 2011

(65) Prior Publication Data

US 2011/0242351 A1 Oct. 6, 2011

(30) Foreign Application Priority Data

Mar. 30, 2010 (JP) ................................. 2010-076599

(51) Int. Cl.
*H04N 3/14* (2006.01)
*H04N 5/335* (2011.01)
*H01L 27/00* (2006.01)
*H01L 31/062* (2012.01)
*H01L 31/113* (2006.01)
*H01L 27/146* (2006.01)

(52) U.S. Cl.
USPC ........ 348/308; 348/302; 250/208.1; 257/291; 257/448

(58) Field of Classification Search
USPC ...... 348/300–310; 250/208.1; 257/291–294, 257/440–448
See application file for complete search history.

(56) References Cited

U.S. PATENT DOCUMENTS

| 6,593,557 | B1 * | 7/2003 | Street .......................... 250/208.1 |
| 7,683,953 | B1 * | 3/2010 | Merrill .......................... 348/308 |
| 8,299,414 | B2 * | 10/2012 | Kondo ....................... 250/208.1 |
| 2005/0248675 | A1 * | 11/2005 | Hashimoto et al. ........... 348/308 |
| 2007/0018074 | A1 * | 1/2007 | Kinoshita .................. 250/208.1 |
| 2010/0045833 | A1 | 2/2010 | Iwabuchi et al. |
| 2010/0045834 | A1 | 2/2010 | Iwabuchi et al. |
| 2010/0066877 | A1 * | 3/2010 | Yamaguchi et al. .......... 348/279 |
| 2010/0134648 | A1 * | 6/2010 | Funatsu et al. ............. 348/222.1 |

FOREIGN PATENT DOCUMENTS

JP 2007-115994 5/2007

* cited by examiner

*Primary Examiner* — Sinh Tran
*Assistant Examiner* — Christopher K Peterson
(74) *Attorney, Agent, or Firm* — Oblon, Spivak, McClelland, Maier & Neustadt, L.L.P.

(57) ABSTRACT

Disclosed herein is a solid-state imaging device including: a plurality of common pixel sections arranged in a matrix form so that pixel signals of a plurality of photoelectric conversion elements arranged in the same row can be output; a plurality of row address lines used to select some of the photoelectric conversion elements in each row; and a scan section that allows for the pixel signals of the plurality of photoelectric conversion elements to be output through addressing adapted to select the plurality of row address lines one at a time in sequence, in which the plurality of row address lines are connected to the plurality of photoelectric conversion elements arranged in the same row in each of the common pixel sections so that the scan section can individually select the plurality of photoelectric conversion elements arranged in the same row in each of the common pixel sections during addressing.

7 Claims, 11 Drawing Sheets

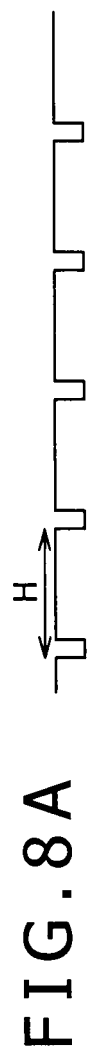
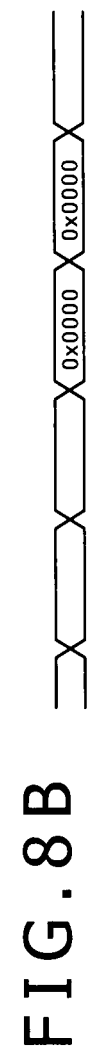
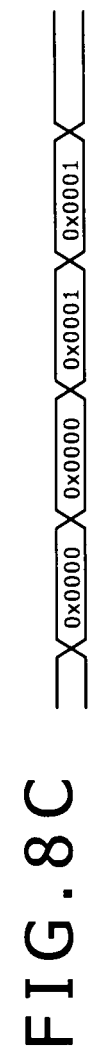
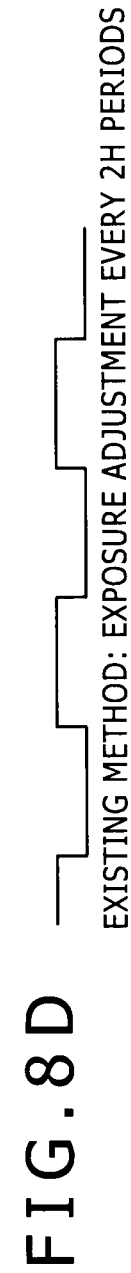
FIG. 8A
FIG. 8B
FIG. 8C
FIG. 8D
EXISTING METHOD: EXPOSURE ADJUSTMENT EVERY 2H PERIODS

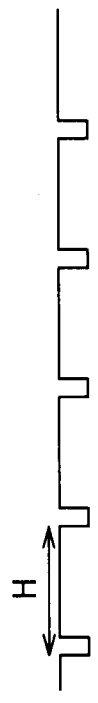
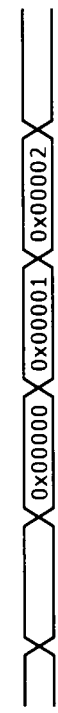
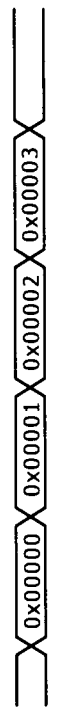
FIG.9A
FIG.9B
FIG.9C
NEW METHOD: EXPOSURE ADJUSTMENT EVERY 1H PERIOD

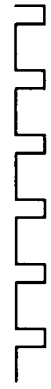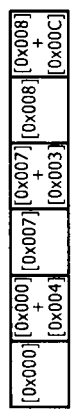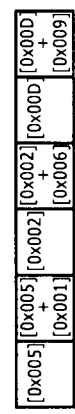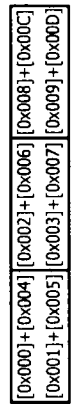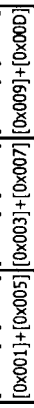
FIG.12A
FIG.12B
FIG.12C
FIG.12D
FIG.12E
FIG.12F
FIG.12G

SOLID-STATE IMAGING DEVICE AND IMAGING DEVICE

BACKGROUND OF THE INVENTION

1. Field of the Invention

The present invention relates to a solid-state imaging device having a plurality of photoelectric conversion elements and an imaging device having the same.

2. Description of the Related Art

A solid-state imaging device includes a plurality of pixel circuits, each having a photoelectric conversion element.

The plurality of pixel circuits are arranged in a two-dimensional matrix on one surface of a semiconductor substrate.

In the plurality of pixel circuits, a row address line is generally connected to each row of the matrix of the pixel circuits, and a column signal line connected to each column thereof. The plurality of row address lines are connected to a vertical scan section.

When the vertical scan section selects a row address line, pixel signals of the photoelectric conversion element in the plurality of pixel circuits connected to the row address line are output from the plurality of pixel circuits to the plurality of column signal lines.

Further, the vertical scan section performs addressing adapted to select all the plurality of row address lines one at a time in sequence every scan period, thus allowing for the solid-state imaging device to output a plurality of pixel signals making up one image every scan period.

Incidentally, each pixel circuit includes, in addition to a photoelectric conversion element, a readout circuit adapted to output a pixel signal, based on the photoelectric conversion element, to a column signal line. The readout circuit includes a plurality of transistors.

Therefore, a possible arrangement would be to share a readout circuit among a plurality of photoelectric conversion elements rather than providing a readout circuit for each photoelectric conversion element (Japanese Patent Laid-Open No. 2007-115994).

This contributes to a reduced number of transistors in each of the readout circuits in the solid-state imaging device as a whole, thus contributing to a larger photoreception area for each photoelectric conversion element.

SUMMARY OF THE INVENTION

However, a readout circuit adapted to output pixel signals of a plurality of photoelectric conversion elements outputs a pixel signal of one photoelectric conversion element selected from among the plurality of photoelectric conversion elements.

A readout circuit cannot simultaneously output a plurality of pixel signals of the plurality of photoelectric conversion elements.

Therefore, if two photoelectric conversion elements connected to one readout circuit are arranged in the same row, the following problem arises.

That is, even if the vertical scan section performs addressing adapted to select one row address line at a time in sequence every scan period, the readout circuit can output only either of the pixel signals of the two photoelectric conversion elements arranged in the same row.

If one readout circuit is associated with two photoelectric conversion elements arranged in the same row as described above, it is possible to read out a plurality of pixel signals making up only half of an image per scan period. As a result, two scan periods are required to read out one image.

On the other hand, the vertical scan section need determine, in addition to addressing, whether the current scan period is the first or second one, and select, according to the determination result, from which of the two photoelectric conversion elements arranged in the same row a pixel signal to be output.

Thus, there is a demand for a solid-state imaging device to be able to output pixel signals of a plurality of photoelectric conversion elements without restraint every scan period when pixel signals of the plurality of photoelectric conversion elements are output from a common pixel section.

A solid-state imaging device according to a first mode of the present invention includes a plurality of common pixel sections, a plurality of row address lines and scan section. The plurality of common pixel sections are arranged in a matrix form so that pixel signals of a plurality of photoelectric conversion elements arranged in the same row can be output. The plurality of row address lines are used to select some of the photoelectric conversion elements in each row. The scan section allows for the pixel signals of the plurality of photoelectric conversion elements to be output through addressing adapted to select the plurality of row address lines one at a time in sequence. The plurality of row address lines are connected to the plurality of photoelectric conversion elements arranged in the same row in each of the common pixel sections so that the scan section can individually select the plurality of photoelectric conversion elements arranged in the same row in each of the common pixel sections during addressing.

In the first mode, the plurality of row address lines are connected to the plurality of photoelectric conversion elements arranged in the same row in each of the common pixel sections so as to permit individual selection of the photoelectric conversion elements during addressing.

As a result, the plurality of photoelectric conversion elements arranged in the same row in each of the common pixel sections can output pixel signals through addressing adapted to select a plurality of row address lines one at a time in sequence.

An imaging device according to a second mode of the present invention includes a solid-state imaging device, optics and signal processing section. The optics guides incident light onto the solid-state imaging device. The signal processing section processes an output signal from the solid-state imaging device. The solid-state imaging device includes a plurality of common pixel sections, a plurality of row address lines and scan section. The plurality of common pixel sections are arranged in a matrix form so that pixel signals of a plurality of photoelectric conversion elements arranged in the same row can be output. The plurality of row address lines are used to select some of the photoelectric conversion elements in each row. The scan section allows for pixel signals of the plurality of photoelectric conversion elements to be output through addressing adapted to select a plurality of row address lines one at a time in sequence. A plurality of row address lines are connected to the plurality of photoelectric conversion elements arranged in the same row in each of the common pixel sections so that the scan section can individually select a plurality of photoelectric conversion elements arranged in the same row in each of the common pixel sections during addressing.

The present invention allows pixel signals of a plurality of photoelectric conversion elements to be output without restraint every scan period when pixel signals of the plurality of photoelectric conversion elements are output from a common pixel section.

BRIEF DESCRIPTION OF THE DRAWINGS

FIGS. 8A to 8D are timing diagrams of the readout in a solid-state imaging device (solid-state imaging device according to a comparative example) that uses addressing in combination with a left/right selection signal;

FIGS. 9A to 9C are timing diagrams of the readout in the solid-state imaging device according to the first embodiment;

FIGS. 11A to 11J are timing diagrams of simultaneous column-by-column summations for two rows in the solid-state imaging device according to the comparative example;

FIGS. 12A to 12G are timing diagrams of simultaneous column-by-column summations for two rows in the solid-state imaging device according to the first embodiment.

DETAILED DESCRIPTION OF THE PREFERRED EMBODIMENTS

A description will be given below of the preferred embodiments of the present invention with reference to the accompanying drawings. It should be noted that the description will be given in the following order:
1. First embodiment (example of the solid-state imaging device)
2. Comparative example (comparative example of the solid-state imaging device)
3. Second embodiment (example of the imaging device)
<1. First Embodiment>
[Configuration of a Solid-State Imaging Device 1]

Figure 1:
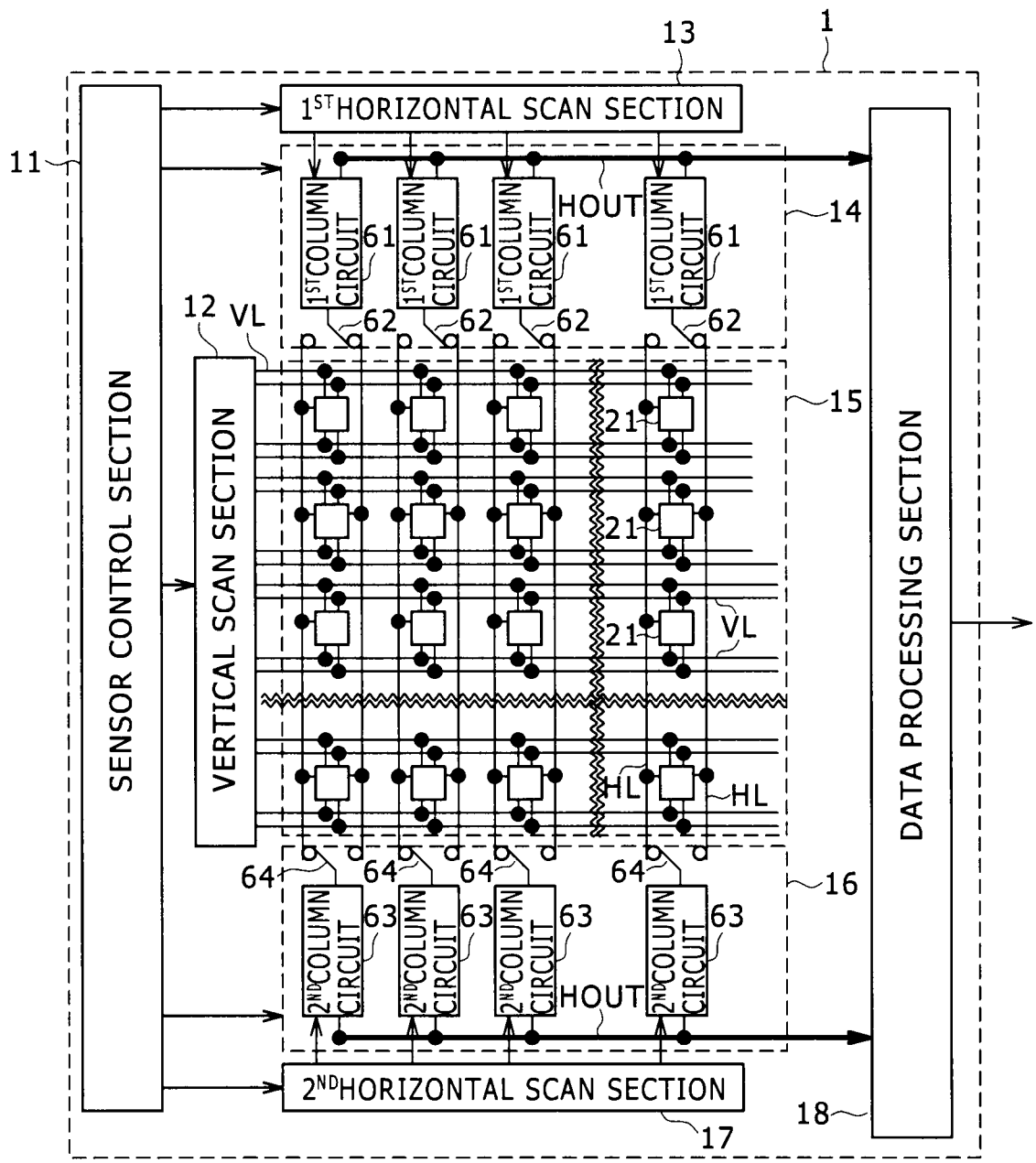
FIG. 1 is a block diagram of a solid-state imaging device according to a first embodiment of the present invention.

FIG. 1 is a block diagram of the solid-state imaging device 1 according to the first embodiment of the present invention.

The solid-state imaging device 1 shown in FIG. 1 includes a sensor control section 11, a vertical scan section 12, a first horizontal scan section 13, a first column processing section 14, a pixel array section 15, a second column processing section 16, a second horizontal scan section 17 and a data processing section 18.

These circuits are laid out on a semiconductor substrate, for example, according to the arrangement as shown in FIG. 1.

Further, the solid-state imaging device 1 shown in FIG. 1 also includes a plurality of vertical signal lines HL, a plurality of vertical address selection lines VL and two horizontal scan lines HOUT.

The pixel array section 15 includes a plurality of shared pixel circuits 21 that are arranged in a two-dimensional matrix on one surface of a semiconductor substrate.

Figure 2:
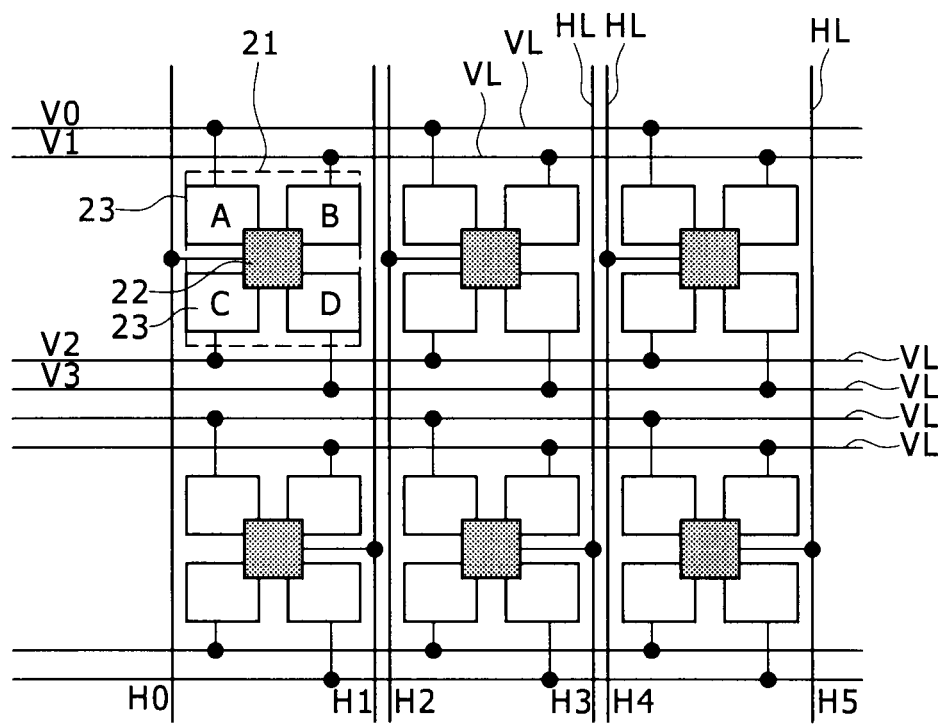
FIG. 2 is a layout diagram showing an enlarged view of part of a pixel array section shown in FIG. 1.

FIG. 2 is a layout diagram showing an enlarged view of part of the pixel array section 15 shown in FIG. 1.

FIG. 2 illustrates the six shared pixel circuits 21 that are arranged in two rows by three columns.

FIG. 2 also illustrates the plurality of vertical address selection lines VL and the plurality of vertical signal lines HL. The vertical address selection lines VL extend along the rows of the plurality of shared pixel circuits 21. The vertical signal lines HL extend along the columns of the plurality of shared pixel circuits 21.

Each of the shared pixel circuits 21 shown in FIG. 2 includes one floating diffusion area (FD area 22) and four pixel areas 23.

The four pixel areas 23 are arranged in two rows by two columns.

The FD area 22 is arranged at the center of the four pixel areas 23.

Hereinafter, if distinction is made between the four pixel areas 23, left, right, top and bottom will be used relative to the orientation shown in FIG. 2.

Figure 3:
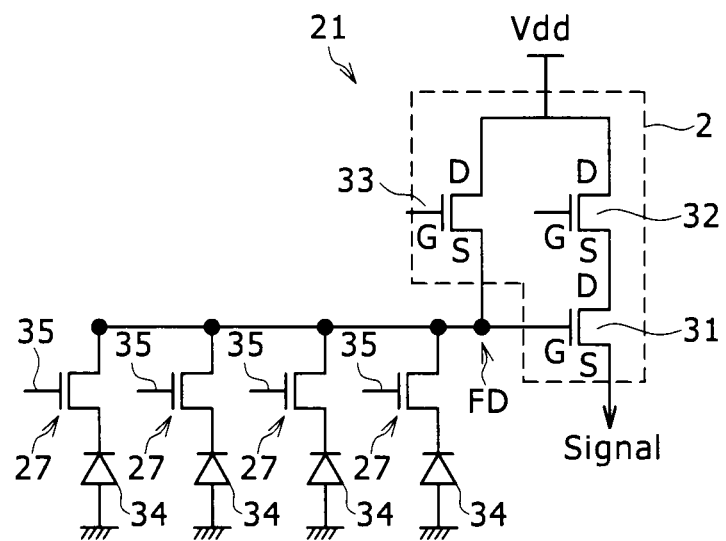
FIG. 3 is a circuit diagram of a shared pixel circuit shown in FIG. 1.

FIG. 3 is a circuit diagram of the shared pixel circuit 21 shown in FIG. 1.

FIG. 3 is a circuit diagram of a four-pixel-sharing structure in which four pixel circuits 27 share a single readout circuit 26.

The readout circuit 26 includes a floating diffusion FD, amplifying transistor 31, selection transistor 32 and reset transistor 33. The readout circuit 26 is arranged, for example, in the FD area 22 shown in FIG. 2.

Each of the pixel circuits 27 includes a photodiode 34 and a transfer gate transistor 35. The four pixel circuits 27 are arranged, each in one of the four pixel areas 23 shown in FIG. 2.

The photodiode 34 converts incident light into charge (electrons in this case) commensurate with the light intensity of the incident light.

The transfer gate transistor 35 is, for example, a MOS (Metal Oxide Semiconductor) transistor.

The transfer gate transistor 35 has its drain connected to the photodiode 34, its source connected to the floating diffusion FD and its gate connected to one of the vertical address selection lines VL.

When ON, the transfer gate transistor 35 transfers the charge generated by the photodiode 34 to the floating diffusion FD.

The reset transistor 33 is, for example, a MOS transistor.

The reset transistor 33 has its drain connected to a power supply Vdd, its source connected to the floating diffusion FD and its gate connected to an unshown reset signal line.

When ON, the reset transistor 33 resets the floating diffusion FD to the potential of the power supply Vdd.

The selection transistor 32 is, for example, a MOS transistor.

The selection transistor 32 has its drain connected to the power supply Vdd, its source connected to the amplifying transistor 31 and its gate connected to one of the vertical address selection lines VL.

The amplifying transistor 31 is, for example, a MOS transistor.

The amplifying transistor 31 has its drain connected to the selection transistor 32, its source connected to one of the vertical signal lines HL and its gate connected to the floating diffusion FD. The amplifying transistor 31 forms a source follower amplifier.

When the selection transistor 32 is ON, the amplifying transistor 31 outputs a pixel signal, commensurate with the potential of the floating diffusion FD, to one of the vertical signal lines HL.

In the shared pixel circuit 21 shown in FIG. 3, the floating diffusion FD is reset, for example, when the reset transistor 33 is turned ON.

Then, when one of the selection transistors 32 is turned ON by one of the vertical address selection lines VL, the charge of the photodiode 34 is transferred to the floating diffusion FD.

When the selection transistor 32 is turned ON, the amplifying transistor 31 outputs a pixel signal, commensurate with the charge accumulated in the floating diffusion FD, to one of the vertical signal lines HL.

As described above, in the shared pixel circuit 21, the floating diffusion FD is shared among the plurality of photodiodes 34.

This makes it impossible for the shared pixel circuit 21 to output pixel signals of the plurality of photodiodes 34 at the same time.

The shared pixel circuit 21 outputs pixel signals of the plurality of photodiodes 34 one at a time.

Figure 4:
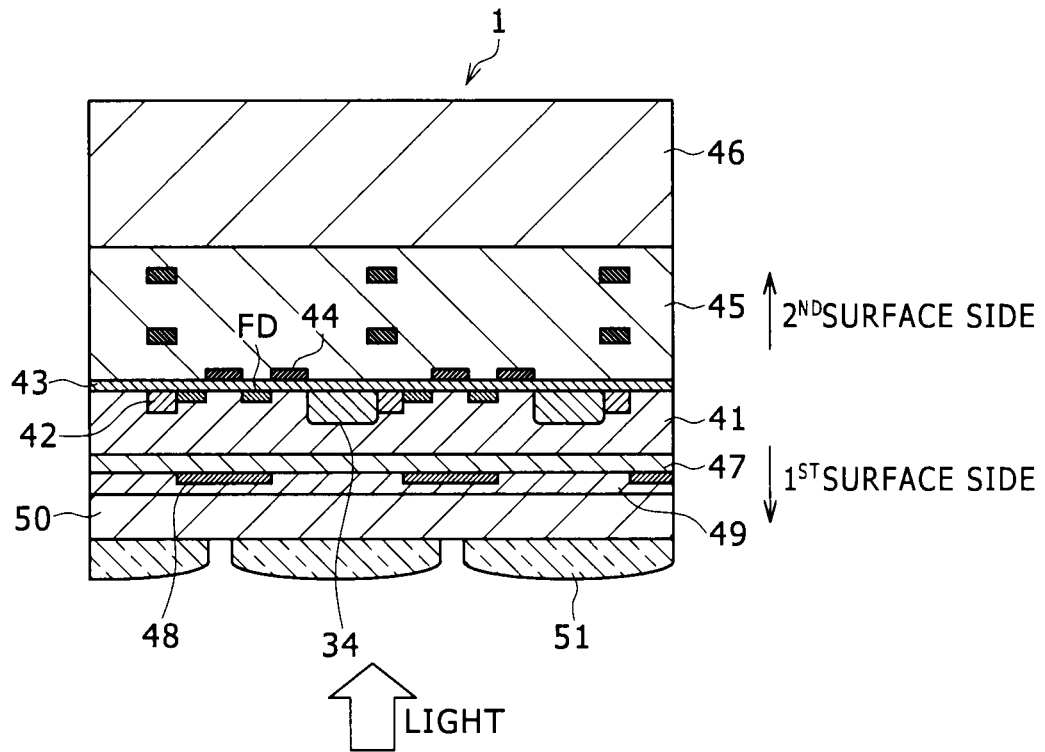
FIG. 4 is a sectional view of major portions of the shared pixel circuit shown in FIG. 3.

FIG. 4 is a sectional view of major portions of the shared pixel circuit 21 shown in FIG. 3.

The shared pixel circuit 21 shown in FIG. 4 is formed, for example, on a p-type silicon substrate (semiconductor substrate) 41.

In regions other than the active region of the silicon substrate 41, an element isolation insulating film 42, for example, is formed. In the active region of the substrate, the plurality of photodiodes 34 making up a unit pixel are formed. An n-type region is formed in the region of the photodiodes 34. More specifically, the photodiodes 34 are formed by the pn junction between this n-type region and the p-type region surrounding the n-type region.

The silicon substrate 41 is thin enough to allow for light to be incident upon the silicon substrate 41 from its rear surface (first surface). Although varying in thickness depending on the type of the solid-state imaging device 1, the silicon substrate 41 is 2 to 6 µm in thickness when used for visible light and 6 to 10 µm in thickness when used for near infrared light.

The floating diffusion FD and the sources or drains of the transistors 31 to 33 making up the readout circuit 26 are formed in the active region of the silicon substrate 41.

A gate 44 of the transfer gate transistor 35 is formed via a gate insulating film 43 made of silicon oxide on a second surface side of the silicon substrate 41. The gate 44 is formed, for example, with polysilicon.

A wiring layer 45 is formed over the transfer gate transistor 35 and other transistors 31 to 33. A support substrate 46 is provided on the wiring layer 45 via an unshown adhesive layer. The support substrate 46 is provided to reinforce the strength of the substrate. The support substrate 46 is made, for example, of the silicon substrate 41.

A silicon oxide film 47 is formed on the first surface side of the substrate. A light-shielding film 48 is formed to have openings where the photodiodes 34 are formed. The light-shielding film 48 is formed, for example, with an aluminum film. On the other hand, if incident light is sufficiently absorbed in the substrate, the light-shielding film 48 need not be formed in the pixel section.

A silicon nitride film 49 is formed over the silicon oxide film 47 and light-shielding film 48. A color filter 50 is formed over the silicon nitride film 49 to transmit only light at a specific range of wavelengths. On-chip lenses 51 are formed on the color filter 50 to focus incident light onto the photodiodes 34.

Figure 5:
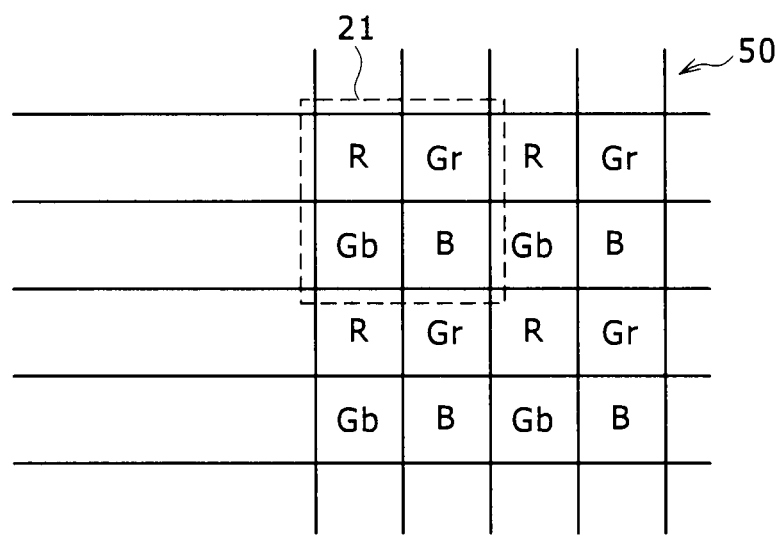
FIG. 5 is an explanatory diagram of a color filter in the shared pixel circuit shown in FIG. 2.

FIG. 5 is an explanatory diagram of the color filter 50 in the shared pixel circuit 21 shown in FIG. 2.

Each of the boxes shown in FIG. 5 is associated with one of the pixel areas 23 where the photodiodes 34 are formed.

In FIG. 5, red R, green G and blue B color component filters are arranged in a Bayer pattern.

As enclosed by a dotted line in FIG. 5, four color component filters, i.e., red R, green Gr, green Gb and blue B, are associated with the photodiodes 34 of the shared pixel circuit 21 arranged in two rows by two columns.

In the color filter 50, a color component pattern, made up of red R, green Gr, green Gb and blue B arranged in two rows by two columns, is repeated for each of the shared pixel circuits 21.

As a result, the color filter 50 allows for light of two different color components to be incident on each row of the two sets or four photodiodes 34 arranged in two rows in each of the shared pixel circuits 21.

Referring back to FIG. 1, the vertical scan section 12 is connected to the plurality of vertical address selection lines VL.

The vertical scan section 12 selects the vertical address selection lines VL one at a time in sequence.

The vertical scan section 12 outputs a pulse signal to the selected vertical address selection line VL.

It should be noted that the vertical scan section 12 can simultaneously select some (e.g., two) of the plurality of vertical address selection lines VL.

In the pixel array section 15, the four vertical address selection lines VL are provided between each pair of adjacent rows of the plurality of shared pixel circuits 21 as illustrated in FIG. 2.

More specifically, the plurality of shared pixel circuits 21 in each row are connected to a total of the four vertical address selection lines VL, two above and two below the shared pixel circuits 21.

More specifically, of the four vertical address selection lines VL, the first vertical address selection line VL (V0) from the top is connected to the transfer gate transistor 35 of a top left pixel area 23(A) in FIG. 2.

The second vertical address selection line VL (V1) from the top is connected to the transfer gate transistor 35 of a top right pixel area 23(B) in FIG. 2.

The third vertical address selection line VL (V2) from the top is connected to the transfer gate transistor 35 of a bottom left pixel area 23(C) in FIG. 2.

The fourth vertical address selection line VL (V3) from the top is connected to the transfer gate transistor 35 of a bottom right pixel area 23(D) in FIG. 2.

Here, the number of the photodiodes 34 arranged in the same row in each of the shared pixel circuits 21 is denoted by Nh (where Nh is a natural number equal to or greater than 2), and the number of rows of the plurality of photodiodes 34 in the pixel array section 15 is denoted by Ny (where Ny is a natural number equal to or greater than 2).

In this case, the number of the plurality of vertical address selection line VL connected to the plurality of shared pixel circuits 21 is expressed by Ny×Nh.

As a result, as the vertical scan section 12 selects the vertical address selection lines VL one at a time in sequence, the four photodiodes 34 of the shared pixel circuit 21 are connected in sequence to the floating diffusion FD, allowing for pixel signals to be output in sequence to the vertical signal lines HL.

On the other hand, each of the vertical address selection lines VL is connected to the plurality of shared pixel circuits 21 arranged straight in a horizontal direction (in each row).

Therefore, the transfer of charge to the floating diffusion FD and transmission of signals to the vertical signal lines HL are conducted in parallel by the plurality of shared pixel circuits 21 connected to the same vertical address selection line VL.

In the pixel array section 15, the two vertical signal lines HL are provided between each pair of adjacent columns of the plurality of shared pixel circuits 21.

Each of the plurality of shared pixel circuits 21 in each column are connected to one of the two or left/right vertical signal lines HL.

More specifically, the amplifying transistors 31 in the shared pixel circuits 21 in the top row shown in FIG. 2 are connected to the vertical signal line HL (e.g., H0) on the left of the column of the shared pixel circuits 21.

On the other hand, the amplifying transistors 31 in the shared pixel circuits 21 in the bottom row shown in FIG. 2 are connected to the vertical signal line HL (e.g., H1) on the right of the column of the shared pixel circuits 21.

The first column processing section 14 includes a plurality of first column circuits 61 and a plurality of first selectors 62.

There are as many first column circuits 61 and as many first selectors 62 as the number of columns of the shared pixel circuits 21.

Each of the first column circuits 61 is connected to one of the first selectors 62. Each of the first selectors 62 is connected to a pair of the vertical signal lines HL in the associated column.

Then, each of the first selectors 62 alternately selects one of the pair of vertical signal lines HL, for example, every scan period.

Each of the first column circuits 61 includes an AD (Analog to Digital) converter, counter, latch and other components.

Each of the first column circuits 61 converts the analog voltage of the pixel signal transferred via one of the first selectors 62 into a digital voltage, performs CDS (Correlated Double Sampling) and holds the resultant count value.

Further, each of the first column circuits 61 includes a calculation section, making it possible for the first column circuits 61 to add together the held count value and a new count value and hold the sum.

The first horizontal scan section 13 is connected to the plurality of first column circuits 61.

The first horizontal scan section 13 outputs a horizontal scan signal to the plurality of first column circuits 61 at predetermined timings in sequence.

When supplied with a horizontal scan signal, each of the first column circuits 61 outputs a held count value signal to a horizontal scan line HOUT shown at the top in FIG. 1.

This allows for the count values for one row held by the plurality of first column circuits 61 to be transferred to the data processing section 18 from the first column processing section 14.

As the plurality of first column circuits 61 are selected one at a time in sequence by the first horizontal scan section 13, the count values for one row (pixel signals) are transferred to the data processing section 18.

The second column processing section 16 includes a plurality of second column circuits 63 a plurality of second selectors 64.

There are as many second column circuits 63 and as many second selectors 64 as the number of columns of the shared pixel circuits 21.

Each of the second column circuits 63 is connected to one of the second selectors 64.

Each of the second selectors 64 is connected to a pair of the vertical signal lines HL in the associated column.

Then, each of the second selectors 64 alternately selects the other of the pair of vertical signal lines HL, for example, every scan period.

Each of the second column circuits 63 includes an AD converter, counter, latch and other components.

Each of the second column circuits 63 converts the analog voltage of the pixel signal transferred via one of the second selectors 64 into a digital voltage, performs CDS (Correlated Double Sampling) and holds the resultant count value.

Further, each of the second column circuits 63 includes a calculation section, making it possible for the second column circuits 63 to add together the held count value and a new count value and hold the sum.

The second horizontal scan section 17 is connected to the plurality of second column circuits 63.

The second horizontal scan section 17 outputs a horizontal scan signal to the plurality of second column circuits 63 at predetermined timings in sequence.

When supplied with a horizontal scan signal, each of the second column circuits 63 outputs a held count value signal to the horizontal scan line HOUT shown at the bottom in FIG. 1.

This allows for the count values for one row held by the plurality of second column circuits 63 to be transferred to the data processing section 18 from the second column processing section 16.

As the plurality of second column circuits 63 are selected one at a time in sequence by the second horizontal scan section 17, the count values for one row (pixel signals) are transferred to the data processing section 18.

As described above, in the solid-state imaging device 1 shown in FIG. 1, the plurality of shared pixel circuits 21 in each column are alternately connected to the pair of vertical signal lines HL, and the pair of vertical signal lines HL are alternately switched and connected to the first and second column circuits 61 and 63.

Further, the first horizontal scan section 13 horizontally scans the plurality of first column circuits 61, and the second horizontal scan section 17 horizontally scans the plurality of second column circuits 63.

In the solid-state imaging device 1 shown in FIG. 1, therefore, the vertical scan section 12 simultaneously selects, of a plurality of row signal lines, multiple row signal lines connected to the shared pixel circuits 21 in different rows, thus allowing for pixel signals to be simultaneously output from the photodiodes 34 in two rows.

The data processing section 18 is connected to the two horizontal scan lines HOUT.

The data processing section 18 is supplied with the count values (pixel signals) of the selected photodiodes 34 from the plurality of first column circuits 61 and the plurality of second column circuits 63 via the two horizontal scan lines HOUT.

The data processing section 18 includes an unshown sorting section and sorts, for example, the supplied count values of the photodiodes 34 in two rows in the sequence in which the photodiodes 34 are arranged.

The data processing section 18 combines, on a row-by-row basis, the signals containing the plurality of count values (pixel signals) obtained after sorting, outputting the combined signals to external equipment.

The sensor control section 11 is connected to the vertical scan section 12, first horizontal scan section 13, first column circuits 61, second column circuits 63, second horizontal scan section 17 and other sections, controlling these various sections.

[Basic Readout of the Solid-State Imaging Device 1]

For example, the sensor control section 11 controls the various sections of the solid-state imaging device 1 in such a manner as to cause the solid-state imaging device 1 to output a captured image signal every scan period.

Further, the sensor control section 11 causes each of the first selectors 62 to select one of the pair of vertical signal lines HL and causes the associated second selector 64 to select the other of the pair of vertical signal lines HL every scan period.

In this condition, the sensor control section 11 instructs the vertical scan section 12 to initiate a scan.

The vertical scan section 12 performs addressing adapted to select the plurality of vertical address selection lines VL one at a time in sequence.

In performing addressing, the vertical scan section 12 selects, for example, the vertical address selection line VL connected to the top left photodiodes 34 of the plurality of shared pixel circuits 21 in the first row from the top in FIG. 1.

In this case, each of the plurality of shared pixel circuits 21 in the first row outputs the pixel signal of its top left photodiode 34 to the associated second column circuit 63.

Each of the plurality of second column circuits 63 holds this pixel signal or count value.

In addition to the above, the vertical scan section 12 selects, for example, the vertical address selection line VL connected to the bottom left photodiodes 34 of the plurality of shared pixel circuits 21 in the second row from the top in FIG. 1.

In this case, each of the plurality of shared pixel circuits 21 in the second row outputs the pixel signal of its bottom left photodiode 34 to the associated first column circuit 61.

Each of the plurality of first column circuits 61 holds this pixel signal or count value.

Then, the sensor control section 11 causes the first horizontal scan section 13 and/or second horizontal scan section 17 to output a horizontal scan signal.

This causes the plurality of first column circuits 61 and/or plurality of second column circuits 63 to output the held pixel signals to the data processing section 18.

The data processing section 18 sorts the count values (pixel signals) supplied from the plurality of first column circuits 61 and/or plurality of second column circuits 63 in the sequence in which the photodiodes 34 are arranged in the pixel array section 15.

The data processing section 18 combines, on a row-by-row basis, the signals containing the plurality of count values (pixel signals) of the photodiodes 34 obtained after sorting, outputting the combined signals to external equipment in a predetermined sequence.

As described above, in the solid-state imaging device 1 shown in FIG. 1, the vertical scan section 12 performs addressing adapted to select the plurality of vertical address selection lines VL one at a time in sequence.

In the solid-state imaging device 1, therefore, the count values (pixel signals) of all the photodiodes 34 arranged in the pixel array section 15 can be output to the data processing section 18 during one scan period.

There are no photodiodes 34 that cannot output their count values (pixel signals) to the data processing section 18 during each scan period.

That is, the solid-state imaging device 1 shown in FIG. 1 is capable of outputting an image signal made up of the pixel signals of all the photodiodes 34 every scan period.

[Column-by-Column Summations of the Solid-State Imaging Device 1]

In addition to the above, the sensor control section 11 may simultaneously read out the pixel signals from the photodiodes 34 in two rows, add up the signals of the plurality of first column circuits 61 and the plurality of second column circuits 63 and output the sums from the solid-state imaging device 1.

For example, the sensor control section 11 can output, from the solid-state imaging device 1, an image signal obtained by column-by-column calculation of the pixel signals of the every other adjacent photodiodes 34 of the same color arranged vertically (in the row direction).

In this case, each of the first column circuits 61 or second column circuits 63 holds the count value (pixel signal) obtained after AD conversion, CDS and other processes in the first scanning period until the next vertical scan period and adds the held count value to the count value (pixel signal) obtained during the next vertical scan period.

Figure 6B:
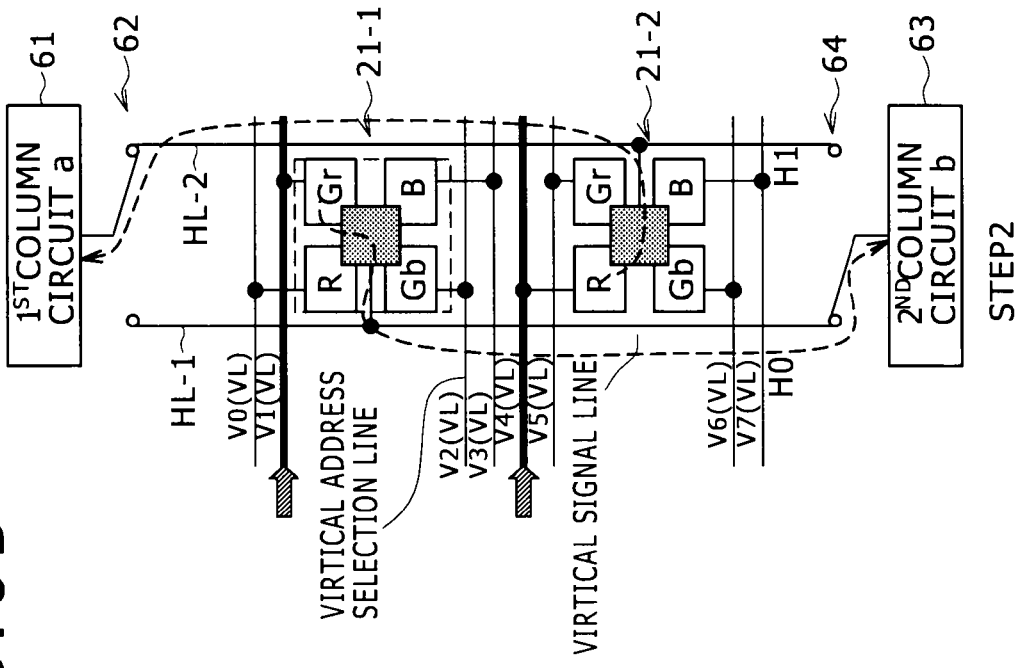
FIGS. 6A and 6B are explanatory diagrams of readout from the pixel array section shown in FIG. 1.
Figure 6A:
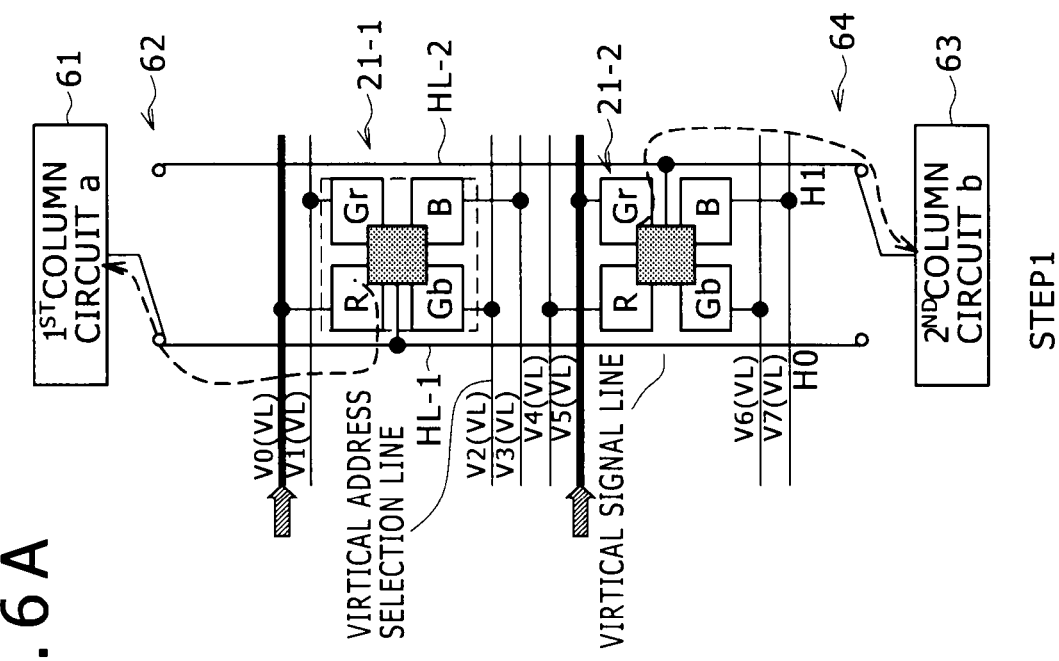

FIGS. 6A and 6B are explanatory diagrams of readout from the pixel array section 15 shown in FIG. 1.

FIGS. 6A and 6B are explanatory diagrams of readout in the solid-state imaging device 1 in FIG. 1 when columns of the pixel signals of the every other adjacent photodiodes 34 of the same color arranged vertically (in the row direction) are added.

FIG. 6A is an explanatory diagram of the first step of addition.

FIG. 6B is an explanatory diagram of the second step of addition.

Figure 7A:
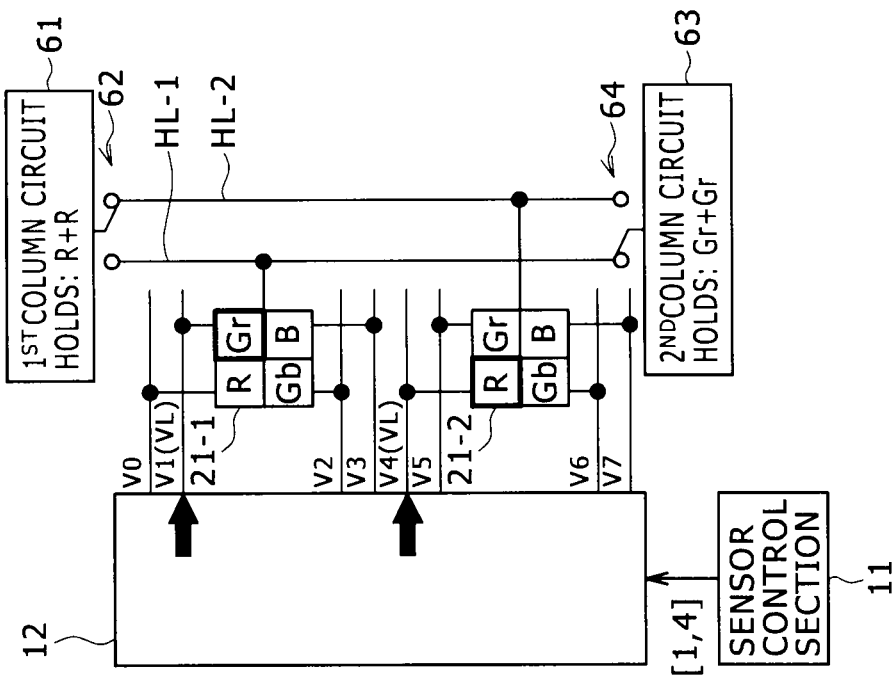
FIGS. 7A and 7B are explanatory diagrams of data held by first and second column circuits respectively after the steps shown in FIGS. 6A and 6B.
Figure 7B:
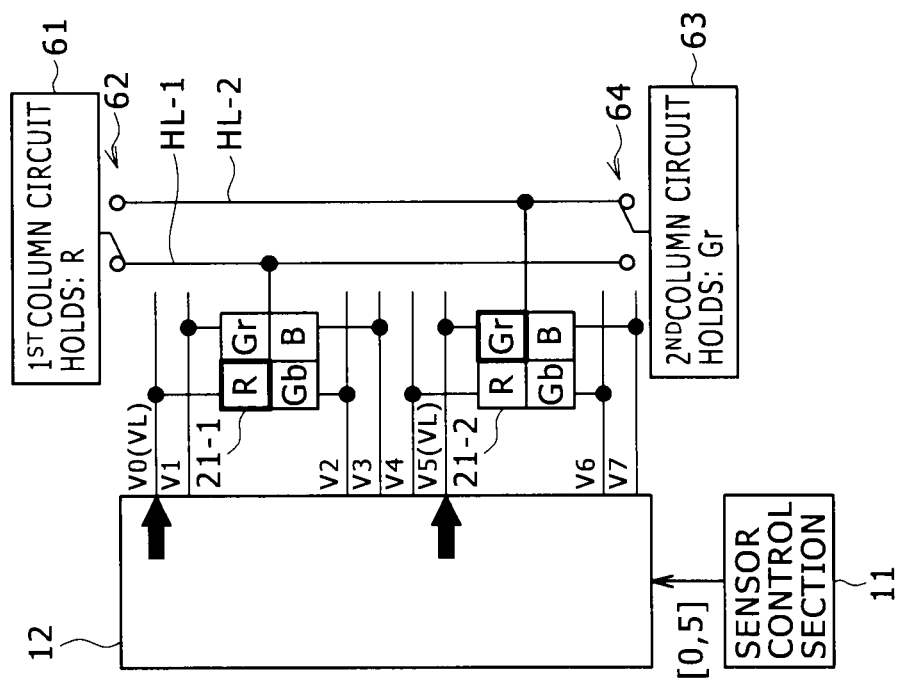

FIGS. 7A and 7B are explanatory diagrams of data held by the first and second column circuits 61 and 63 respectively after the steps shown in FIGS. 6A and 6B.

FIG. 7A is an explanatory diagram of held data after the first step.

FIG. 7B is an explanatory diagram of held data after the second step.

FIGS. 6A to 7B illustrate first and second shared pixel circuits 21-1 and 21-2.

The second shared pixel circuit 21-2 is adjacent to and located below the first shared pixel circuit 21-1 (in the row direction).

In the first and second shared pixel circuits 21-1 and 21-2, 'R,' 'Gr,' 'Gb' and 'B' shown on the four pixel areas 23 represent the red, green, green and blue color components received by the photodiodes 34 of the respective pixel areas 23.

Further, in FIGS. 6A to 7B, a first vertical signal line HL-1 is shown on the left of the first and second shared pixel circuits 21-1 and 21-2, and a second vertical signal line HL-2 is shown on the right thereof.

In the first step, the sensor control section 11 outputs vertical addresses 0 and 5 to the vertical scan section 12 as illustrated in FIG. 7A.

The vertical scan section 12 decodes these addresses, selects vertical address selection lines V0 and V5 and outputs readout pulses.

Further, the first vertical signal line HL-1 is connected to the first selector 62, and the second vertical signal line HL-2 is connected to the second selector 64.

As a result, the charge, accumulated in a pixel area 23(R) of the first shared pixel circuit 21-1 connected to the vertical address selection line V0, is transferred to the floating diffusion FD of the first shared pixel circuit 21-1 as illustrated in FIG. 6A. Then, the accumulated charge is converted into a voltage and transferred to the first column circuit 61 via the first vertical signal line HL-1.

The first column circuit 61 converts the transferred analog pixel signal voltage of the pixel area 23(R) of the first shared pixel circuit 21-1 into a digital signal, performs CDS and holds the resultant value (refer to FIG. 7A).

Similarly, the charge, accumulated in a pixel area 23(Gr) of the second shared pixel circuit 21-2 connected to the vertical address selection line V5, is transferred to the floating diffusion FD of the second shared pixel circuit 21-2 as illustrated in FIG. 6A. Then, the accumulated charge is converted into a voltage and transferred to the second column circuit 63 via the second vertical signal line HL-2.

The second column circuit 63 converts the transferred analog pixel signal voltage of the pixel area 23(Gr) of the second shared pixel circuit 21-2 into a digital signal, performs CDS and holds the resultant value (refer to FIG. 7A).

In the second step, the sensor control section 11 outputs vertical addresses 1 and 4 to the vertical scan section 12 as illustrated in FIG. 7B.

The vertical scan section 12 decodes these addresses, selects vertical address selection lines V1 and V4 and outputs readout pulses.

Further, in the second step, each of the first and second selectors 62 and 64 is switched from one signal line to another. The second vertical signal line HL-2 is connected to the first column circuit 61, and the first vertical signal line HL-1 is connected to the second column circuit 63.

As a result, the charge, accumulated in the pixel area 23(Gr) of the first shared pixel circuit 21-1 connected to the vertical address selection line V1, is transferred to the second column circuit 63 via the first vertical signal line HL-1 as illustrated in FIG. 6B.

The second column circuit 63 converts the transferred analog pixel signal voltage of the pixel area 23(Gr) of the first shared pixel circuit 21-1 into a digital signal and performs CDS.

Further, the second column circuits 63 adds together the count value (pixel signal) of the green component (Gr) held in the first step and the count value (pixel signal) of the green component (Gr) generated anew in the second step and holds the sum (refer to FIG. 7B).

Similarly, the charge, accumulated in the pixel area 23(R) of the second shared pixel circuit 21-2 connected to the vertical address selection line V4, is transferred to the first column circuit 61 via the second vertical signal line HL-2 as illustrated in FIG. 6B.

The first column circuit 61 converts the transferred analog pixel signal voltage of the pixel area 23(R) of the second shared pixel circuit 21-2 into a digital signal and performs CDS.

Further, the first column circuits 61 adds together the count value (pixel signal) of the red component (R) held in the first step and the count value (pixel signal) of the red component (R) generated anew in the second step and holds the sum (refer to FIG. 7B).

As a result of the above column-by-column calculation, the first column circuit 61 holds the sum of the count value (pixel signal) of the pixel area 23(R) of the first shared pixel circuit 21-1 and the count value (pixel signal) of the pixel area 23(R) of the second shared pixel circuit 21-2.

Similarly, the second column circuit 63 holds the sum of the count value (pixel signal) of the pixel area 23(Gr) of the first shared pixel circuit 21-1 and the count value (pixel signal) of the pixel area 23(Gr) of the second shared pixel circuit 21-2.

Then, the first horizontal scan section 13 scans the plurality of first column circuits 61, and the second horizontal scan section 17 scans the plurality of second column circuits 63.

The data processing section 18 is supplied with the summation data of the pixel areas 23(R) held by the plurality of first column circuits 61 and the summation data of the pixel areas 23(Gr) held by the plurality of second column circuits 63.

The data processing section 18 sorts these pieces of summation data to rearrange them in the sequence in which the plurality of pixel areas 23 of different color component are arranged in each row in the pixel array section 15.

The data processing section 18 outputs the plurality of pieces of summation data for one row in the sequence in which the plurality of pixel areas 23 of different color component are arranged in the pixel array section 15.

As described above, the data processing section 18 is supplied with the plurality of pieces of summation data for one row from the plurality of first column circuits 61 and the plurality of second column circuits 63.

This eliminates the need for the data processing section 18 to hold the summation data, for example, until all the pieces of summation data are available.

The data processing section 18 can immediately output the plurality of pieces of supplied summation data.

As described above, in the first embodiment, the vertical scan section 12 selects the plurality of photodiodes 34, arranged in the same row of each of the shared pixel circuits 21, one at a time during addressing.

In the first embodiment, therefore, although the plurality of photodiodes 34 are arranged in the same row in each of the shared pixel circuits 21, it is possible to output pixel signals of the plurality of photodiodes 34 arranged in the same row in each of the shared pixel circuits 21.

Hence, despite the fact that pixel signals of the plurality of photodiodes 34 are output from each of the shared pixel circuits 21, the solid-state imaging device 1 according to the first embodiment allows for pixel signals of the plurality of photodiodes 34 to be output without restraint every scan period.

Further, in the first embodiment, the vertical scan section 12 can simultaneously select the two vertical address selection lines VL connected to the shared pixel circuits 21 in different rows during addressing.

This makes it possible to output pixel signals from the photodiodes 34 in the plurality of rows during a single selection made by the vertical scan section 12 in the first embodiment.

Further, in the first embodiment, the first and second selectors 62 and 64 alternately select the different column signal lines of each pair every scan period during which the vertical scan section 12 performs addressing adapted to select the plurality of vertical address selection lines VL one at a time in sequence.

Still further, in the first embodiment, the first and second column circuits 61 and 63 add together the pixel signals of the two photodiodes 34 in the same row output from the two shared pixel circuits 21 adjacent vertically (in the row direction) to each other and connected to the different column signal lines during two scan periods.

As a result, in the first embodiment, the first and second column circuits 61 and 63 add together the pixel signals of the two photodiodes 34 in the same row every two scan periods, thus providing the summation results for one row.

Still further, in the first embodiment, the first and second column circuits 61 and 63 can add together the pixel signals of the two adjacent photodiodes 34 of the same color in the same row thanks to the column-by-column calculation capability.

Moreover, in the first embodiment, the pixel signals of the two adjacent photodiodes 34 of the same color are supplied to the first and second column circuits 61 and 63 by using two scan periods.

This provides the sum of the pixel signals of the adjacent photodiodes 34 of the same color on a row-by-row basis through a single column-by-column calculation by the plurality of first column circuits 61 and the plurality of second column circuits 63 in the first embodiment.

As a result, there is no need to provide any line memories or other storage devices at the subsequent stage of the first and second column circuits 61 and 63 in order to make available the summation results for one row.

Still further, in the first embodiment, the data processing section 18 is supplied with all the results of summation for one row at once from the plurality of first column circuits 61 and the plurality of second column circuits 63.

As a result, the data processing section 18 can output the results of column-by-column summations that have been output from the plurality of first column circuits 61 and the plurality of second column circuits 63 in such a manner that each piece of the output data contains the data for each row. The data processing section 18 can do so simply by sorting the summation results in the sequence in which the plurality of photodiodes 34 are arranged.

Incidentally, when the CMOS solid-state imaging device 1 is driven in rolling shutter mode, the sensor control section 11 must output a reset row address and readout row address to the vertical scan section 12 during a horizontal scan period.

The term "reset row address" refers to the address of the row in which the charge is reset.

The term "readout row address" refers to the address in which the charge is read out.

When supplied with a reset row address, the vertical scan section 12 latches and decodes the address and outputs a reset pulse signal to the vertical address selection line VL.

Further, when supplied with a readout row address, the vertical scan section 12 latches and decodes the address and outputs a readout pulse signal to the vertical address selection line VL.

[Comparison with the Solid-State Imaging Device According to the Comparative Example Using Addressing in Combination with a Left/Right Selection Signal (Difference in Exposure Cycle)]

If, unlike the first embodiment, the vertical scan section 12 and each of the shared pixel circuits 21 are connected every row by the single vertical address selection line VL, the vertical scan section 12 performs addressing adapted to select the shared pixel circuits 21 of each row one at a time in sequence.

In this case, the two photodiodes 34 arranged in the same row in each of the shared pixel circuits 21 must be selected, for example, by a left/right selection signal that are switched every scan period.

As a result, when addressing is used in combination with a left/right selection signal, it is only possible to select the plurality of photodiodes 34 every other row during a horizontal scan period.

Further, if the sensor control section 11 specifies a reset row address and readout row address to the vertical scan section 12 during a horizontal scan period, the photodiodes 34 relating to these addresses must be selected from the same column.

That is, the photodiode 34 to be reset and the photodiode 34 to be read out must be selected from among those in the same column.

Further, two horizontal scan periods are required to select all the photodiodes 34.

As a result, when addressing is used in combination with a left/right selection signal, the exposure time is controlled in minimum units of two horizontal scan periods.

FIGS. 8A to 8D are timing diagrams of the readout in the solid-state imaging device 1 according to a comparative example that uses addressing in combination with a left/right selection signal.

FIG. 8A illustrates a vertical synchronizing pulse. FIG. 8B illustrates a read vertical address. FIG. 8C illustrates a reset vertical address. FIG. 8D illustrates a left/right selection signal.

In the solid-state imaging device 1 according to the comparative example, the read vertical address and reset vertical address are switched every two scan periods.

During these two scan periods, the left/right selection signal is switched from left to right or vice versa.

As described above, in the solid-state imaging device 1 according to the comparative example, the reset and readout must be switched every two horizontal scan periods.

In contrast, the first embodiment allows for individual addressing of the two photodiodes 34 arranged in the same row of each of the shared pixel circuits 21.

The first embodiment permits selection of the plurality of photodiodes 34 without restraint during one scan period.

In the first embodiment, therefore, all the photodiodes 34 can be selected during one horizontal scan period. As a result, the exposure time is controlled in minimum units of one horizontal scan period.

In the first embodiment, the exposure time can be adjusted in units of one horizontal scan period.

FIGS. 9A to 9C are timing diagrams of the readout in the solid-state imaging device 1 according to the first embodiment.

FIGS. 9A to 9C show the same signals as FIGS. 8A to 8C, respectively.

In the solid-state imaging device 1 according to the first embodiment, the read vertical address and reset vertical address are switched every scan period.

As described above, in the solid-state imaging device 1 according to the first embodiment, the reset and readout can be switched every horizontal scan period.

[Comparison with the Solid-State Imaging Device According to the Comparative Example Using Addressing in Combination with a Left/Right Selection Signal (Difference in Column-by-Column Calculation Cycle)]

On the other hand, when a column-by-column summation is performed in a column circuit such as the first or second column circuit 61 or 63, it is necessary to continuously read out the pixel signals of the same color of the adjacent shared pixel circuits 21 and transfer the signals to the same column circuit.

In the solid-state imaging device 1 according to the comparative example using addressing in combination with a left/right selection signal, it is only possible to select the photodiodes 34 in every other row during a horizontal scan period.

Therefore, if column-by-column summations are performed by simultaneously accessing two addresses for faster readout, the data processing section 18 requires data storage areas (line memories) for two or more rows to sort data.

In contrast, in the first embodiment, an address is assigned to each of the two photodiodes 34 arranged in the same row.

The first embodiment permits selection of the photodiode 34 in a row different from that to be reset without restraint.

This contributes to reduced data storage areas (e.g., line memories) of the data processing section 18 mentioned above in the first embodiment.

Further, if, for example, the pixel signals of the photodiodes 34 in two rows are added together, each of the first and second column circuits 61 and 63 adds together the pixel signals of the photodiodes 34 in two rows in the two steps (two horizontal scan periods) shown in FIGS. 7A and 7B.

As a result, the data processing section 18 can immediately output the data obtained by column-by-column calculation.

In contrast, if addressing is used in combination with a left/right selection signal, it is only possible to select the photodiodes 34 in the same row as that to be reset during each horizontal scan period.

As a result, it is necessary to add together the data in four rows two rows at a time over four steps (four horizontal scan periods) through column-by-column summations.

Further, the data processing section 18 need store the data accumulated over the first three steps and, when supplied with the fourth piece of data, sort these pieces of data and output the resultant data.

<2. Comparative Example>
[Configuration of the Solid-State Imaging Device 1 and Column-by-Column Summations]

Figure 10A:
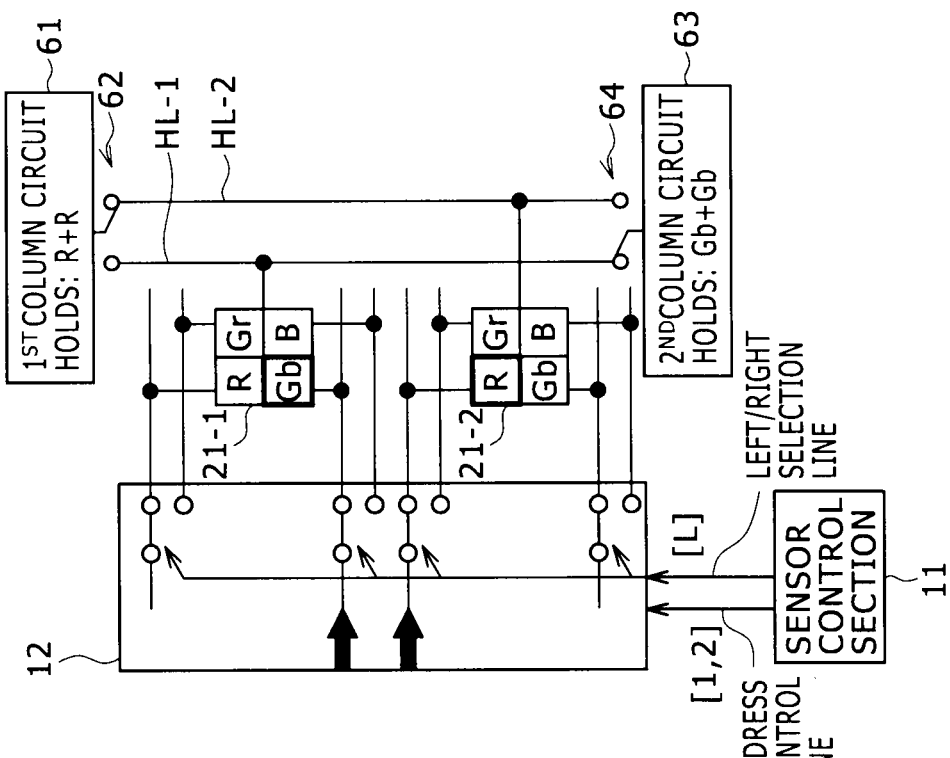
FIGS. 10A and 10B are block diagrams of major components of the solid-state imaging device according to the comparative example.
Figure 10B:
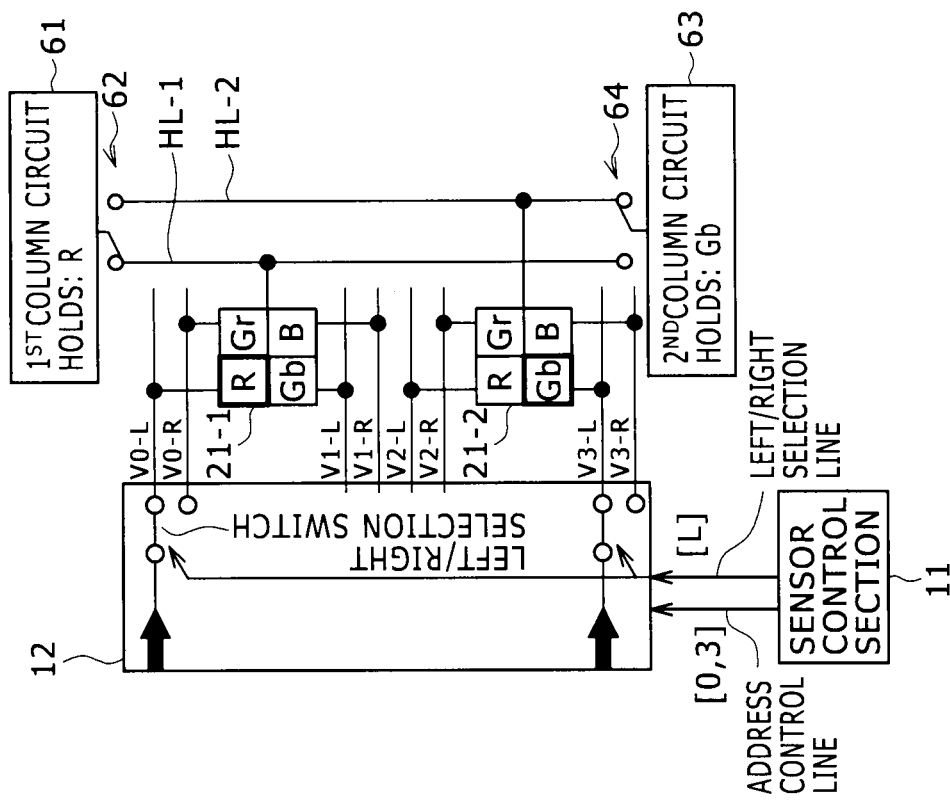

FIGS. 10A and 10B are block diagrams of major components of the solid-state imaging device 1 according to the comparative example.

Further, FIGS. 10A and 10B are explanatory diagrams of column-by-column summations in the solid-state imaging device 1 according to the comparative example using addressing in combination with a left/right selection signal.

FIG. 10A is an explanatory diagram of the first step of the four steps of summation.

FIG. 10B is an explanatory diagram of the second step.

It should be noted that, in the description of the comparative example, the same reference numerals are used to denote like components to those in the first embodiment to facilitate the comparison with the solid-state imaging device 1 according to the first embodiment.

Further, unlike the actual wiring, FIGS. 10A and 10B show the connection between the vertical scan section 12 and each of the adjacent shared pixel circuits 21 with four selection lines to facilitate the comparison with FIGS. 7A and 7B.

In the shared pixel circuit 21 illustrated at the top in FIGS. 10A and 10B, for example, four selection lines, i.e., a first selection line V0-L adapted to select the top left pixel area 23, a first selection line V0-R adapted to select the top right pixel area 23, a first selection line V1-L adapted to select the bottom left pixel area 23 and a first selection line V1-R adapted to select the bottom right pixel area 23, are shown.

In reality, the vertical scan section 12 and each of the shared pixel circuits 21 are connected by the vertical address selection line VL and left/right selection signal lines. The vertical address selection line VL is provided one for each of the shared pixel circuits 21.

In the first step, the sensor control section 11 outputs vertical addresses 0 and 3 and a left selection signal L to the vertical scan section 12 as illustrated in FIG. 10A.

In this case, the vertical scan section 12 can select only the photodiodes 34 in the left columns of the shared pixel circuits 21. Therefore, the vertical scan section 12 decodes these addresses, selects the signal lines V0-L and V3-L and outputs readout pulses.

Further, the first selector 62 selects the left vertical signal line HL, and the second selector 64 selects the right vertical signal line HL.

As a result, the charge, accumulated in the pixel area 23(R) of the first shared pixel circuit 21-1 connected to the signal line V0, is transferred to the floating diffusion FD of the first shared pixel circuit 21-1. Then, the accumulated charge is converted into a voltage and transferred to the first column circuit 61 via the left vertical signal line HL.

The first column circuit 61 converts the transferred analog pixel signal voltage of the pixel area 23(R) of the first shared pixel circuit 21-1 into a digital signal, performs CDS and holds the resultant value.

Similarly, the charge, accumulated in a pixel area 23(Gb) of the second shared pixel circuit 21-2 connected to the signal line V3, is transferred to the floating diffusion FD of the second shared pixel circuit 21-2. Then, the accumulated charge is converted into a voltage and transferred to the second column circuit 63 via the right vertical signal line HL.

The second column circuit 63 converts the transferred analog pixel signal voltage of the pixel area 23(Gb) of the second shared pixel circuit 21-2 into a digital signal, performs CDS and holds the resultant value.

In the second step, the sensor control section 11 outputs vertical addresses 1 and 2 and the left selection signal L to the vertical scan section 12 as illustrated in FIG. 10B.

In this case, the vertical scan section 12 can select only the photodiodes 34 in the left columns of the shared pixel circuits 21. Therefore, the vertical scan section 12 decodes these addresses, selects the signal lines V1-L and V2-L and outputs readout pulses.

Further, the first selector 62 selects the right vertical signal line HL, and the second selector 64 selects the left vertical signal line HL.

As a result, the charge, accumulated in the pixel area 23(R) of the second shared pixel circuit 21-2 connected to the signal line V2, is transferred to the floating diffusion FD of the second shared pixel circuit 21-2. Then, the accumulated charge is converted into a voltage and transferred to the first column circuit 61 via the right vertical signal line HL.

The first column circuit 61 converts the transferred analog pixel signal voltage of the pixel area 23(R) of the first shared pixel circuit 21-1 into a digital signal and performs CDS.

Further, the first column circuit 61 adds together the pixel signal of the pixel area 23(R) of the second shared pixel circuit 21-2 generated anew and the held pixel signal of the pixel area 23(R) of the first shared pixel circuit 21-1 and holds the sum.

Similarly, the charge, accumulated in the pixel area 23(Gb) of the first shared pixel circuit 21-1 connected to the signal line V1, is transferred to the floating diffusion FD of the first shared pixel circuit 21-1. Then, the accumulated charge is converted into a voltage and transferred to the second column circuit 63 via the left vertical signal line HL.

The second column circuit 63 converts the transferred analog pixel signal voltage of the pixel area 23(Gb) of the first shared pixel circuit 21-1 into a digital signal and performs CDS.

Further, the second column circuit 63 adds together the pixel signal of the pixel area 23(Gb) of the first shared pixel circuit 21-1 generated anew and the held pixel signal of the pixel area 23(Gb) of the second shared pixel circuit 21-2 and holds the sum.

Then, the summation result data for the plurality of first column circuits 61 and the plurality of second column circuits 63 is transferred to the data processing section 18.

The data processing section 18 is supplied with only the summation result data for half of the photodiodes 34 in each row. Therefore, the data processing section 18 stores the transferred data in line memories or other storage devices so as to make available the data for one row.

In the third step, the sensor control section 11 outputs the vertical addresses 0 and 3 and a right selection signal R to the vertical scan section 12.

In this case, the vertical scan section 12 can select only the photodiodes 34 in the right columns of the shared pixel circuits 21. Therefore, the vertical scan section 12 decodes these addresses, selects the signal lines V0-R and V3-R and outputs readout pulses.

Further, the first selector 62 selects the left vertical signal line HL, and the second selector 64 selects the right vertical signal line HL.

As a result, the charge, accumulated in the pixel area 23(Gr) of the first shared pixel circuit 21-1 connected to the signal line V0, is transferred to the floating diffusion FD of the first shared pixel circuit 21-1. Then, the accumulated charge is converted into a voltage and transferred to the first column circuit 61 via the left vertical signal line HL.

The first column circuit 61 converts the transferred analog pixel signal voltage of the pixel area 23(Gr) of the first shared pixel circuit 21-1 into a digital signal, performs CDS and holds the resultant value.

Similarly, the charge, accumulated in the pixel area 23(B) of the second shared pixel circuit 21-2 connected to the signal line V3, is transferred to the floating diffusion FD of the second shared pixel circuit 21-2. Then, the accumulated charge is converted into a voltage and transferred to the second column circuit 63 via the right vertical signal line HL.

The second column circuit 63 converts the transferred analog pixel signal voltage of the pixel area 23(B) of the second shared pixel circuit 21-2 into a digital signal, performs CDS and holds the resultant value.

In the fourth step, the sensor control section 11 outputs the vertical addresses 1 and 2 and right selection signal R to the vertical scan section 12.

In this case, the vertical scan section 12 can select only the photodiodes 34 in the right columns of the shared pixel circuits 21. Therefore, the vertical scan section 12 decodes these addresses, selects the signal lines V1-R and V2-R and outputs readout pulses.

Further, the first selector 62 selects the right vertical signal line HL, and the second selector 64 selects the left vertical signal line HL.

As a result, the charge, accumulated in the pixel area 23(Gr) of the second shared pixel circuit 21-2 connected to the signal line V2, is transferred to the floating diffusion FD of the second shared pixel circuit 21-2. Then, the accumulated charge is converted into a voltage and transferred to the first column circuit 61 via the right vertical signal line HL.

The first column circuit 61 converts the transferred analog pixel signal voltage of the pixel area 23(Gr) of the second shared pixel circuit 21-2 into a digital signal and performs CDS.

Further, the first column circuit 61 adds together the pixel signal of the pixel area 23(Gr) of the second shared pixel circuit 21-2 generated anew and the held pixel signal of the pixel area 23(Gr) of the first shared pixel circuit 21-1 and holds the sum.

Similarly, the charge, accumulated in the pixel area 23(B) of the first shared pixel circuit 21-1 connected to the signal line V1, is transferred to the floating diffusion FD of the first shared pixel circuit 21-1. Then, the accumulated charge is converted into a voltage and transferred to the second column circuit 63 via the left vertical signal line HL.

The second column circuit 63 converts the transferred analog pixel signal voltage of the pixel area 23(B) of the first shared pixel circuit 21-1 into a digital signal and performs CDS.

Further, the second column circuit 63 adds together the pixel signal of the pixel area 23(B) of the first shared pixel circuit 21-1 generated anew and the held pixel signal of the pixel area 23(B) of the second shared pixel circuit 21-2 and holds the sum.

Then, the summation result data for the plurality of first column circuits 61 and the plurality of second column circuits 63 is transferred to the data processing section 18.

As a result, the summation result data for the photodiodes 34 in all the rows is available in the data processing section 18.

The data processing section 18 sorts these pieces of summation data and outputs a plurality of pixel signals each containing the summation data put together for one of the rows according to the sequence of arrangement of the photodiodes 34.

[Column-by-Column Summations of the Solid-State Imaging Device According to the Comparative Example]

FIGS. 11A to 11J are timing diagrams of simultaneous column-by-column summations for two rows in the solid-state imaging device 1 according to the comparative example.

FIG. 11A illustrates a vertical synchronizing pulse. FIG. 11B illustrates a left/right selection signal. FIG. 11C illustrates a first read vertical address signal relating to column-by-column summation. FIG. 11D illustrates a second read vertical address signal relating to column-by-column summation. FIG. 11E illustrates a switching signal output from the sensor control section 11 to the first and second selectors 62 and 64. FIG. 11F illustrates data held by the first column circuit 61. FIG. 11G illustrates data held by the second column circuit 63. FIG. 11H illustrates data held by a first line memory of the data processing section 18. FIG. 11I illustrates data held by a second line memory of the data processing section 18. FIG. 11J illustrates an image signal output from the data processing section 18.

When column-by-column summations are performed in the solid-state imaging device 1 according to the comparative example, the left/right selection signal is switched from left to right or vice versa, and first and second read vertical addresses are output basically every scan period.

Each of the column switching selectors is also switched from left to right or vice versa basically every scan period.

During the first scan period, the first column circuit 61 holds the pixel signal (count value) at the first read vertical address. The second column circuit 63 holds the pixel signal (count value) at the second read vertical address.

During the second scan period, the first column circuit 61 holds the sum of the held pixel signal (count value) at the first read vertical address and the pixel signal (count value) at the second read vertical address transferred anew.

On the other hand, the second column circuit 63 holds the sum of the held pixel signal (count value) at the second read vertical address and the pixel signal (count value) at the first read vertical address transferred anew.

These first sums are transferred from the first and second column circuits 61 and 63 to the data processing section 18 through horizontal scans.

During the third scan period, the data processing section 18 holds the first sums in the first line memory.

On the other hand, the first and second column circuits 61 and 63 initiate the second summations.

The second sums are transferred from the first and second column circuits 61 and 63 to the data processing section 18 during the fourth scan period shown in FIGS. 11A to 11J.

As a result of the column-by-column summations over the above four scan periods, the data processing section 18 holds four sets of column-by-column sums.

More specifically, the data processing section 18 holds the column-by-column sum of the pixel signal of the top left photodiode 34 of the first shared pixel circuit 21-1 at address 0x00 and the pixel signal of the top left photodiode 34 of the second shared pixel circuit 21-2 at address 0x02.

Further, the data processing section 18 holds the column-by-column sum of the pixel signal of the bottom left photodiode 34 of the second shared pixel circuit 21-2 at address 0x03 and the pixel signal of the bottom left photodiode 34 of the first shared pixel circuit 21-1 at address 0x01.

Still further, the data processing section 18 holds the column-by-column sum of the pixel signal of the top right photodiode 34 of the first shared pixel circuit 21-1 at address 0x00 and the pixel signal of the top right photodiode 34 of the second shared pixel circuit 21-2 at address 0x02.

Still further, the data processing section 18 holds the column-by-column sum of the pixel signal of the bottom right photodiode 34 of the second shared pixel circuit 21-2 at address 0x03 and the pixel signal of the bottom right photodiode 34 of the first shared pixel circuit 21-1 at address 0x01.

As described above, in the solid-state imaging device 1 according to the comparative example, the plurality of column-by-column sums for two rows are available in the data processing section 18 for the first time as a result of column-by-column summations over four scan periods.

Then, the data processing section 18 outputs a plurality of column-by-column sums each for one of the rows according to the sequence of arrangement of the photodiodes 34.

[Column-by-Column Summations of the Solid-State Imaging Device According to the First Embodiment]

FIGS. 12A to 12G are timing diagrams of simultaneous column-by-column summations for two rows in the solid-state imaging device 1 according to the first embodiment.

FIG. 12A illustrates a vertical synchronizing pulse. FIG. 12B illustrates a first read vertical address signal relating to column-by-column summation. FIG. 12C illustrates a second read vertical address signal relating to column-by-column summation. FIG. 12D illustrates a switching signal output from the sensor control section 11 to the first and second selectors 62 and 64. FIG. 12E illustrates data held by the first column circuit 61. FIG. 12F illustrates data held by the second column circuit 63. FIG. 12G illustrates an image signal output from the data processing section 18.

When column-by-column summations are performed in the solid-state imaging device 1 according to the first embodiment, first and second read vertical addresses are output every scan period.

Each of the column switching selectors is also switched from left to right or vice versa basically every scan period.

During the first scan period, the first column circuit 61 holds the pixel signal (count value) at the first read vertical address. The second column circuit 63 holds the pixel signal (count value) at the fifth read vertical address.

During the second scan period, the first column circuit 61 holds the sum of the held pixel signal (count value) at the first read vertical address and the pixel signal (count value) at the fourth read vertical address transferred anew.

On the other hand, the second column circuit 63 holds the sum of the held pixel signal (count value) at the fifth read vertical address and the pixel signal (count value) at the first read vertical address transferred anew.

These first sums are transferred from the first and second column circuits 61 and 63 to the data processing section 18 through horizontal scans.

As described above, in the solid-state imaging device 1 according to the first embodiment, it is possible to allow for the data processing section 18 to hold two sets of column-by-column sums as a result of column-by-column summations over two scan periods.

More specifically, the data processing section 18 holds the column-by-column sum of the pixel signal of the top left photodiode 34 of the first shared pixel circuit 21-1 at address 0x000 and the pixel signal of the top left photodiode 34 of the second shared pixel circuit 21-2 at address 0x004.

Further, the data processing section 18 holds the column-by-column sum of the pixel signal of the top right photodiode 34 of the first shared pixel circuit 21-1 at address 0x001 and the pixel signal of the top right photodiode 34 of the second shared pixel circuit 21-2 at address 0x005.

Then, in the first embodiment, the plurality of column-by-column sums for one row are available in the data processing section 18 as a result of summations over two scan periods.

Then, the data processing section 18 outputs a plurality of column-by-column sums each for one of the rows according to the sequence of arrangement of the photodiodes 34.

Therefore, the first and second line memories are not required for the data processing section 18 in the first embodiment.

<3. Second Embodiment>

[Configuration and Operation of an Imaging Device 101]

Figure 13:
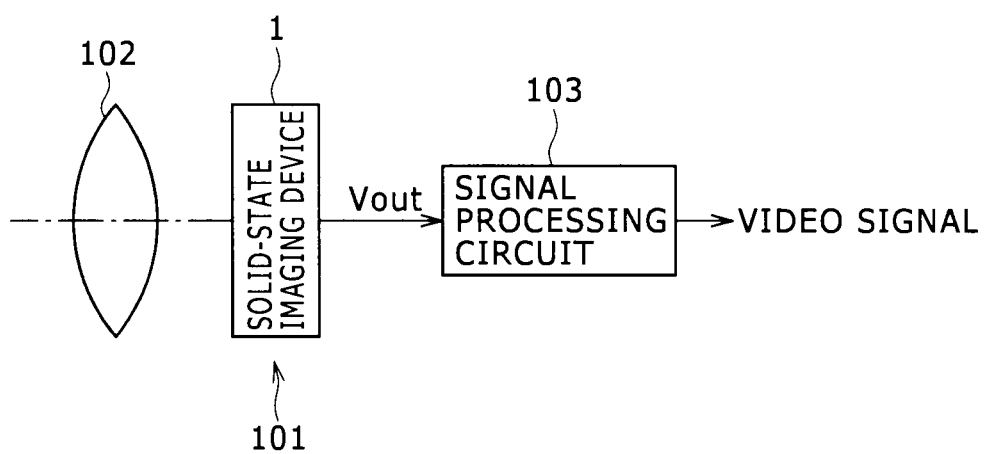
FIG. 13 is a block diagram of an imaging device according to a second embodiment of the present invention.

FIG. 13 is a block diagram of the imaging device 101 according to a second embodiment of the present invention.

The imaging device 101 shown in FIG. 13 includes the solid-state imaging device 1 according to the first embodiment, an optics 102 and a signal processing circuit 103.

The imaging device 101 shown in FIG. 13 is, for example, a video camcorder, digital still camera or electronic endoscopic camera.

The optics 102 forms an image of image light (incident light) from the subject on the solid-state imaging device 1.

As a result, the incident light is converted into a signal charge commensurate with the incident light intensity by the photodiodes 34 of the solid-state imaging device 1. The signal charge is accumulated in the photodiodes 34 for a given period of time.

The signal processing circuit 103 subjects the output signals from the solid-state imaging device 1 to various types of signal processing and outputs the resultant signal.

In the imaging device 101 shown in FIG. 13, the solid-state imaging device 1 outputs pixel signals in the sequence of the plurality of photodiodes 34 every scan period.

Further, even when the solid-state imaging device 1 performs column-by-column summations of the pixel signals of the adjacent photodiodes of the same color in the same column, the image signals obtained by column-by-column summations are output in the sequence of the plurality of photodiodes 34.

The signal processing circuit 103 processes the image signals supplied from the solid-state imaging device 1 through signal processing conducted in a given sequence. The signal processing is designed to process the pixel signals of the photodiodes 34, for example, starting from those of the top left photodiodes 34 shown in FIG. 1 according to the sequence of arrangement of the plurality of photodiodes 34 in the solid-state imaging device 1.

That is, the signal processing circuit 103 can process the image signals output from the solid-state imaging device 1 according to the first embodiment by following the same predetermined process steps as when the solid-state imaging device 1 according to the comparative example is connected.

Although the above embodiments are preferred embodiments of the present invention, the present invention is not limited thereto but may be modified or changed without departing from the scope of the invention.

In the above embodiments, for example, the shared pixel circuits 21 are provided one for each two rows by two columns of the photodiodes 34.

In addition to the above, the shared pixel circuits 21 may be provided one for each one row by two columns or one for each one row by three columns of the photodiodes 34.

If the shared pixel circuits 21 are each shared by the plurality of photodiodes 34 in a row as described above, it is only necessary to connect the vertical scan section 12 and each of the shared pixel circuits 21 by the plurality of vertical address selection lines VL adapted to individually select the plurality of photodiodes 34.

This provides the same advantageous effects as the embodiments.

In the above embodiments, the first and second column circuits 61 and 63 add together two pixel signals, one read first and another read later, during column-by-column calculations.

In addition to the above, the first and second column circuits 61 and 63 may subtract a pixel signal, either one read first or later, from the other during column-by-column calculations.

In the above embodiments, the plurality of shared pixel circuits 21 in each column are each connected alternately to one of the pair of vertical signal lines HL. The connections between the two vertical signal lines HL and the first and second column circuits 61 and 63 are switched by the first and second selectors 62 and 64.

In addition to the above, for example, the plurality of shared pixel circuits 21 in each column are connected to the pair of vertical signal lines HL by the first and second selectors 62 and 64, and the two vertical signal lines HL may be connected in a fixed manner to the first and second column circuits 61 and 63.

In the above embodiments, the plurality of shared pixel circuits 21 in each column are each connected alternately to one of the pair of vertical signal lines HL.

In addition to the above, the plurality of shared pixel circuits 21 in each column may be all connected to the single vertical signal line HL or three or more vertical signal lines HL one at a time in sequence.

In the above embodiments, the first and second column circuits 61 and 63 are provided.

In addition to the above, only the first column circuits 61 may be provided. On the other hand, third column circuits may be provided.

The imaging device 101 according to the second embodiment is, for example, a video camcorder, digital still camera or electronic endoscopic camera.

In addition to the above, for example, the imaging device 101 may be used when camera capability is provided in electronic equipment such as mobile phone, PDA (Personal Data Assistance), electronic note device, computer device or mobile player.

The present application contains subject matter related to that disclosed in Japanese Priority Patent Application JP 2010-076599 filed in the Japan Patent Office on Mar. 30, 2010, the entire content of which is hereby incorporated by reference.

What is claimed is:

1. A solid-state imaging device comprising:
a plurality of common pixel sections arranged in a matrix form so that pixel signals of a plurality of photoelectric conversion elements arranged in the same row can be output;
a plurality of column signal lines associated with columns of the plurality of common pixel sections to which the plurality of common pixel sections in the columns are alternately connected;
a first selector adapted to select one of the plurality of column signal lines;
a first column section supplied with a pixel signal from the one column signal line selected by the first selector;
a second selector adapted to select the other of the plurality of column signal lines;
a second column section supplied with a pixel signal from the other column signal line selected by the second selector;
a plurality of row address lines used to select some of the photoelectric conversion elements in each row; and
a scan section that allows for the pixel signals of the plurality of photoelectric conversion elements to be output through addressing adapted to select the plurality of row address lines one at a time in sequence, wherein
the plurality of row address lines are connected to the plurality of photoelectric conversion elements arranged in the same row in each of the common pixel sections so that the scan section can individually select the plurality of photoelectric conversion elements arranged in the same row in each of the common pixel sections during addressing,
the first and second selectors select the different column signal lines of the plurality of column signal lines in each column in sequence every scan period during which the scan section performs addressing adapted to select the plurality of row address lines one at a time in sequence, and
the first and second column sections perform, during a plurality of scan periods, calculations of the pixel signals of the plurality of photoelectric conversion elements output from the two shared pixel sections arranged adjacent to each other in the row direction and connected to the different column signal lines.

2. The solid-state imaging device of claim 1, wherein the scan section simultaneously selects the plurality of row address lines connected to the common pixel sections in different rows during the addressing.

3. The solid-state imaging device of claim 1 comprising:
a plurality of color filters adapted to cause light of different color components to be incident on the plurality of photoelectric conversion elements arranged in the same row in each of the common pixel sections, wherein
the first and second column sections are supplied, during the plurality of scan periods, with pixel signals of the plurality of adjacent photoelectric conversion elements of the same color and add together the plurality of pixel signals of the same color.

4. The solid-state imaging device of claim 1, wherein the number of the plurality of row address lines connected to the plurality of common pixel sections is expressed by $Ny \times Nh$ where Nh is the number of photoelectric conversion elements arranged in the same row in each of the common pixel sections, and Ny is the number of rows of photoelectric conversion elements in the arrangement of the plurality of common pixel sections, each of Nh and Ny being natural number equal to or greater than 2.

5. A solid-state imaging device of comprising:
a plurality of common pixel sections arranged in a matrix form so that pixel signals of a plurality of photoelectric conversion elements arranged in the same row can be output;
a plurality of column signal lines associated with each column of the plurality of common pixel sections and to which the plurality of common pixel sections in the column are alternately connected;
a plurality of first selectors each adapted to select one of the plurality of column signal lines in each column;
a plurality of first column sections each supplied with a pixel signal from the one column signal line selected by the first selector;
a plurality of second selectors each adapted to select the other of the plurality of column signal lines in each column;

a plurality of second column sections each supplied with a pixel signal from the other column signal line selected by the second selectors;
a plurality of row address lines used to select some of the photoelectric conversion elements in each row; and
a scan section that allows for the pixel signals of the plurality of photoelectric conversion elements to be output through addressing adapted to select the plurality of row address lines one at a time in sequence, wherein
the plurality of row address lines are connected to the plurality of photoelectric conversion elements arranged in the same row in each of the common pixel sections so that the scan section can individually select the plurality of photoelectric conversion elements arranged in the same row in each of the common pixel sections during addressing,
the first and second selectors in each column select the different column signal lines of the plurality of column signal lines in each column in sequence every scan period during which the scan section performs addressing adapted to select the plurality of row address lines one at a time in sequence, and
the first and second column sections in each column perform, during a plurality of scan periods, calculations of the pixel signals of the plurality of photoelectric conversion elements output from the two shared pixel sections arranged adjacent to each other in the row direction and connected to the different column signal lines.

6. An imaging device comprising:
a solid-state imaging device;
an optics adapted to guide incident light onto the solid-state imaging device; and
a signal processing section adapted to process an output signal from the solid-state imaging device, wherein
the solid-state imaging device includes
  a plurality of common pixel sections arranged in a matrix form so that pixel signals of a plurality of photoelectric conversion elements arranged in the same row can be output;
  a plurality of column signal lines associated with columns of the plurality of common pixel sections to which the plurality of common pixel sections in the columns are alternately connected;
  a first selector adapted to select one of the plurality of column signal lines;
  a first column section supplied with a pixel signal from the one column signal line selected by the first selector;
  a second selector adapted to select the other of the plurality of column signal Lines;
  a second column section supplied with a pixel signal from the other column signal line selected by the second selector;
  a plurality of row address lines used to select some of the photoelectric conversion elements in each row; and
  a scan section that allows for the pixel signals of the plurality of photoelectric conversion elements to be output through addressing adapted to select the plurality of row address lines one at a time in sequence, wherein
the plurality of row address lines are connected to the plurality of photoelectric conversion elements arranged in the same row in each of the common pixel sections so that the scan section can individually select the plurality of photoelectric conversion elements arranged in the same row in each of the common pixel sections during addressing,
the first and second selectors select the different column signal lines of the plurality of column signal lines in each column in sequence every scan period during which the scan section performs addressing adapted to select the plurality of row address lines one at a time in sequence, and
the first and second column sections perform, during a plurality of scan periods, calculations of the pixel signals of the plurality of photoelectric conversion elements output from the two shared pixel sections arranged adjacent to each other in the row direction and connected to the different column signal lines.

7. An imaging device comprising:
a solid-state imaging device;
an optics adapted to guide incident light onto the solid-state imaging device; and
a signal processing section adapted to process an output signal from the solid-state imaging device, wherein
the solid-state imaging device includes
  a plurality of common pixel sections arranged in a matrix form so that pixel signals of a plurality of photoelectric conversion elements arranged in the same row can be output;
  a plurality of column signal lines associated with each column of the plurality of common pixel sections and to which the plurality of common pixel sections in the column are alternately connected;
  a plurality of first selectors each adapted to select one of the plurality of column signal lines in each column;
  a plurality of first column sections each supplied with a pixel signal from the one column signal line selected by the first selector;
  a plurality of second selectors each adapted to select the other of the plurality of column signal lines in each column;
  a plurality of second column sections each supplied with a pixel signal from the other column signal line selected by the second selector;
  a plurality of row address lines used to select some of the photoelectric conversion elements in each row; and
  a scan section that allows for the pixel signals of the plurality of photoelectric conversion elements to be output through addressing adapted to select the plurality of row address lines one at a time in sequence, wherein
the plurality of row address lines are connected to the plurality of photoelectric conversion elements arranged in the same row in each of the common pixel sections so that the scan section can individually select the plurality of photoelectric conversion elements arranged in the same row in each of the common pixel sections during addressing,
the first and second selectors in each column select the different column signal lines of the plurality of column signal lines in each column in sequence every scan period during which the scan section performs addressing adapted to select the plurality of row address lines one at a time in sequence, and
the first and second column sections in each column perform, during a plurality of scan periods, calculations of the pixel signals of the plurality of photoelectric conversion elements output from the two shared pixel sections arranged adjacent to each other in the row direction and connected to the different column signal lines.

* * * * *